(12) United States Patent
Hung

(10) Patent No.: US 11,133,610 B2
(45) Date of Patent: Sep. 28, 2021

(54) BASE OF ELECTRICAL CONNECTOR AND ELECTRICAL CONNECTOR THEREOF

(71) Applicant: Dongguan Luxshare Technologies Co., Ltd, Dongguan (CN)

(72) Inventor: Yung-Chih Hung, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/918,750

(22) Filed: Jul. 1, 2020

(65) Prior Publication Data

US 2020/0335888 A1 Oct. 22, 2020

(30) Foreign Application Priority Data

Nov. 4, 2019 (TW) .................................. 108139986

(51) Int. Cl.
*H01R 12/50* (2011.01)
*H01R 12/58* (2011.01)
(Continued)

(52) U.S. Cl.
CPC ......... *H01R 12/58* (2013.01); *H01R 12/7005* (2013.01); *H01R 13/26* (2013.01);
(Continued)

(58) Field of Classification Search
CPC .... H01R 12/58; H01R 12/7005; H01R 12/55; H01R 12/51; H01R 12/50; H01R 12/7011; H01R 13/434; H01R 13/428; H01R 13/42; H01R 13/40; H01R 13/26; H01R 13/502; H01R 13/6271; H01R 13/629;
(Continued)

(56) References Cited

U.S. PATENT DOCUMENTS 4,746,306 A * 5/1988 Yurtin .................. H01R 13/641
439/352
5,257,944 A * 11/1993 Kennedy .............. H01R 13/639
439/347
(Continued)

FOREIGN PATENT DOCUMENTS

CN 1574483 A 2/2005
CN 1682414 B 5/2010
(Continued)

*Primary Examiner* — Harshad C Patel
(74) *Attorney, Agent, or Firm* — Birch, Stewart, Kolasch & Birch LLP

(57) ABSTRACT

A base of an electrical connector includes a fixing pin and a base body. The fixing pin includes a pin body, a stopping element and one or more latches. The pin body includes a lower end and an upper end, the stopping element is disposed at the upper end, and the latch is disposed on the pin body in a protruding manner. One or more installation troughs are formed on a rear surface of the base body and the installation trough is in communication with a front surface of the base body through an insertion hole. The base body further includes a pin hole formed on an outer peripheral surface of the base body, and the pin hole is intersected with and in communication with the installation trough. The latch is adapted to be engaged with a stopper block formed on an inner wall of the pin hole.

12 Claims, 13 Drawing Sheets

(51) Int. Cl.
*H05K 3/30* (2006.01)
*H01R 13/26* (2006.01)
*H01R 13/502* (2006.01)
*H01R 13/629* (2006.01)
*H01R 13/627* (2006.01)
*H01R 12/70* (2011.01)

(52) U.S. Cl.
CPC ......... *H01R 13/502* (2013.01); *H01R 13/629* (2013.01); *H01R 13/6271* (2013.01); *H05K 3/301* (2013.01); *H05K 3/308* (2013.01); *H05K 2201/10189* (2013.01)

(58) Field of Classification Search
CPC .... H01R 13/20; H01R 13/6275; H01R 13/62; H05K 3/301; H05K 3/308
USPC ............... 439/626, 489, 349, 352, 350, 357
See application file for complete search history.

(56) References Cited

U.S. PATENT DOCUMENTS

| | | | | | |
|---|---|---|---|---|---|
| 5,270,550 | A | * | 12/1993 | Martorana | F28D 20/02 250/505.1 |
| 5,348,493 | A | * | 9/1994 | Power | H01R 13/641 439/350 |
| 5,637,009 | A | * | 6/1997 | Tsuji | H01R 13/639 439/347 |
| 5,653,613 | A | * | 8/1997 | Shimoda | H01R 13/4361 439/752 |
| 5,775,957 | A | * | 7/1998 | Fink | H01R 13/4361 439/595 |
| 5,848,456 | A | * | 12/1998 | Sjoqvist | H01R 13/6275 24/618 |
| 6,098,938 | A | * | 8/2000 | Tsai | G06F 1/183 248/200 |
| 6,152,783 | A | * | 11/2000 | Tsuchiya | H01R 13/4361 439/752 |
| 7,037,130 | B2 | * | 5/2006 | Dillon | H01R 13/6275 439/357 |
| 7,201,599 | B2 | * | 4/2007 | Holub | H01R 13/506 439/352 |
| 7,744,408 | B2 | | 6/2010 | Komatsu | |
| 7,988,502 | B2 | * | 8/2011 | Nagano | H01R 13/426 439/752 |
| 8,323,049 | B2 | | 12/2012 | Ngo | |
| 10,454,209 | B2 | * | 10/2019 | Holub | H01R 13/506 |
| 10,855,025 | B2 | * | 12/2020 | Holub | H01R 13/4362 |
| 2002/0127913 | A1 | * | 9/2002 | Ichio | H01R 13/4361 439/595 |
| 2004/0132351 | A1 | * | 7/2004 | Miyakawa | H01R 13/4361 439/752 |
| 2014/0302702 | A1 | * | 10/2014 | Germ | H01R 13/639 439/370 |
| 2014/0357130 | A1 | * | 12/2014 | Endo | H01R 13/4361 439/626 |
| 2017/0170601 | A1 | * | 6/2017 | Chen | H01R 13/426 |

FOREIGN PATENT DOCUMENTS

| | | |
|---|---|---|
| CN | 203747183 U | 7/2014 |
| CN | 102301537 B | 8/2014 |
| CN | 206283014 U | 6/2017 |
| CN | 206283046 U | 6/2017 |
| CN | 206806561 U | 12/2017 |
| CN | 206908021 U | 1/2018 |
| CN | 207265268 U | 4/2018 |

* cited by examiner

BASE OF ELECTRICAL CONNECTOR AND ELECTRICAL CONNECTOR THEREOF

CROSS-REFERENCE TO RELATED APPLICATION

This application claims the priority benefit of Taiwan application serial No. 108139986, filed on Nov. 4, 2019. The entirety of the above-mentioned patent application is hereby incorporated by reference herein and made a part of specification.

BACKGROUND

Technical Field

This disclosure relates to an electrical connector structure, in particular, to a base of an electrical connector for quickly assembling and fixing terminals, and to an electrical connector using the base of the electrical connector.

Related Art

An electrical connector, such as a connector on a circuit board for receiving external power or signals, usually includes an electrical-insulated base and plural electrical terminals. Depending on different types of external terminals, the electrical terminals are provided with different types as well.

The electrical terminals are usually inserted into the base from the front surface or rear surface of the base, in a one-by-one manner, and then the electrical terminals are fixed by fixing pins or other fixing elements. The size of the electrical terminals is usually small, and thus the corresponding fixing pin or other fixing component is also small. Therefore, there is a problem of difficulty in operating the fixing pin. At the same time, the insertion of the fixing pin has a problem of directional matching which ensures the latch to be fixed into the latch-hole position correctly. Due to the small size of the fixing pin, the aforementioned directional matching is likely to fail, and reworks on the assembly of the fixing pin and the electrical terminal having failed directional matching are difficult.

SUMMARY

In order to further improve the assembly process of the electrical connector, especially the fixing operation of the electrical terminals, the disclosure discloses a base of an electrical connector, which can easily and quickly fix to the electrical terminals to form an electrical connector.

A base of an electrical connector according to this disclosure comprises a fixing pin and a base body. The fixing pin includes a pin body, a stopping element and at least one latch. The pin body has a lower end and an upper end, the stopping element is disposed on at the upper end, and the at least one latch is disposed on the pin body in a protruding manner. The base body includes a front surface, a rear surface, and an outer peripheral surface. The front surface and the rear surface are opposite to each other, and the outer peripheral surface is connected to the front surface and the rear surface. At least one installation trough is formed on the rear surface and the at least one installation trough is in communication with the front surface through an insertion hole. The base body further includes a pin hole formed on the outer peripheral surface. The pin hole is intersected with and in communication with the at least one installation trough. At least one stopper block is formed on an inner wall of the pin hole. The pin hole is adapted to be inserted by the fixing pin, and the at least one latch is adapted to be engaged with the at least one stopper block.

In one or some embodiments, the fixing pin includes two of the latches, and the latches are respectively disposed on two opposite sides of the pin body in a protruding manner.

In one or some embodiments, the fixing pin further includes a stopping element disposed at the upper end.

In one or some embodiments, a shallow recess is formed at an opening portion of the pin hole for receiving the stopping element.

In one or some embodiments, the fixing pin further includes a positioning portion disposed on the pin body in a protruding manner, and a positioning groove is formed on an edge of the shallow recess for allowing the positioning portion to pass therethrough.

In one or some embodiments, the stopping element extends toward a front side of the pin body.

In one or some embodiments, the stopping element is disposed at the upper end and extends toward two lateral sides of the pin body.

In one or some embodiments, the pin body further includes a hollow part, and a position of the at least one latch corresponds to a position of the hollow part.

In one or some embodiments, the hollow part is a closed opening.

In one or some embodiments, the hollow part is an open slot, and an opening of the open slot is at the lower end or the upper end.

An electrical connector according to this disclosure comprises an aforementioned base and at least one electrical terminal. The at least one electrical terminal includes a body portion and a mounting portion. The body portion includes a front edge, a rear edge, and two lateral edges. The mounting portion extends from the rear edge. The body portion and the mounting portion are disposed in the at least one installation trough. At least one of the side edges of the body portion forms a bent portion. When the fixing pin is inserted into the pin hole, the pin body stops the bent portion, so as to stop the bent portion from moving toward the rear surface of the base body.

In one or some embodiments, a cross-sectional area of the insertion hole is smaller than a cross-sectional area of the at least one installation trough, so that a stepped segment is formed between the insertion hole and the at least one installation trough. When the front edge of the body portion abuts against the stepped segment between the insertion hole and the at least one installation trough, a portion of the bent portion close to the rear edge does not shield the pin hole.

In one or some embodiments, the electrical terminal further includes a contact portion formed at the front edge of the body portion for being inserted into the insertion hole.

In one or some embodiments, the bent portion includes a notch, and at least on a portion of the notch corresponding to the front edge is closed. When the fixing pin is inserted into the pin hole, the fixing pin further passes through the notch.

In one or some embodiments, the bent portion includes a notch. The notch is an opening, a recessed structure formed on an edge of the bent portion, or an edge of a sheet structure formed on the edge of the bent portion.

In one or more embodiments of this disclosure, the fixing pin can be firmly fixed in the base body through a simple insertion operation to form a base of an electrical connector having a fixed structure. As long as the electrical terminal has a bent portion capable of interfering with the fixing pin, the electrical terminal can be applied to the base. The electrical terminal and the base of the electrical connector can be quickly assembled into an electrical connector, which effectively accelerating the assembly process of the electrical connector.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
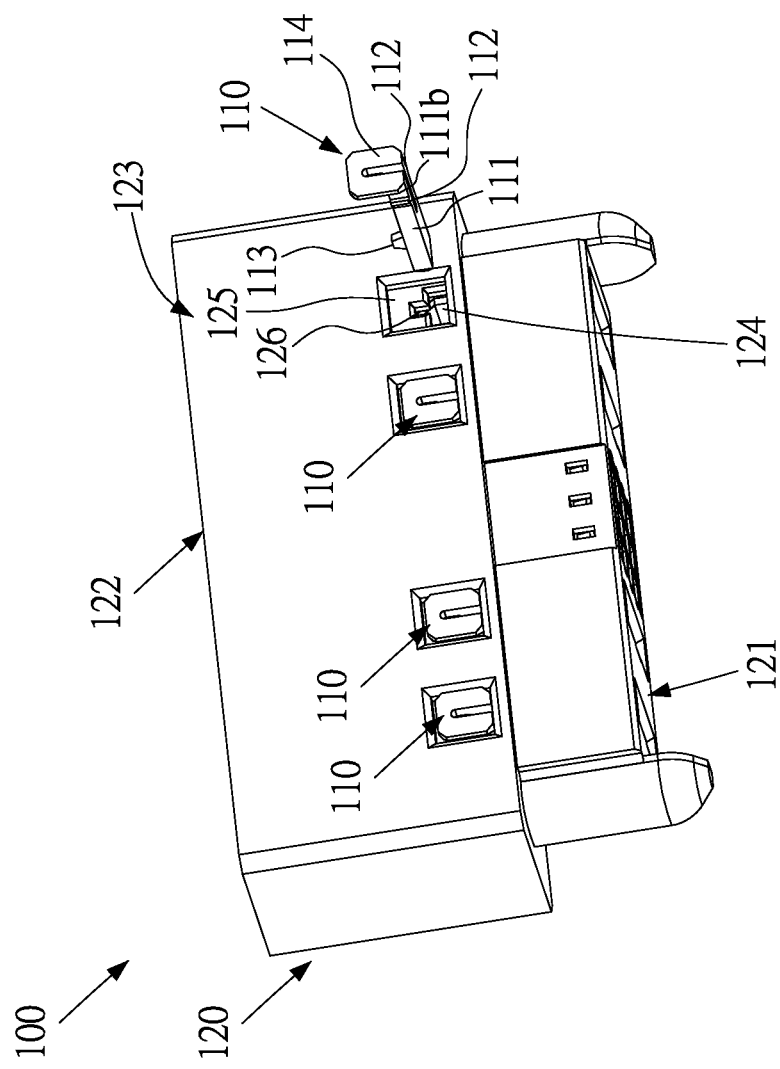
FIG. 1 illustrates an exploded view of a base of an electrical connector according to a first embodiment of this disclosure.
Figure 2:
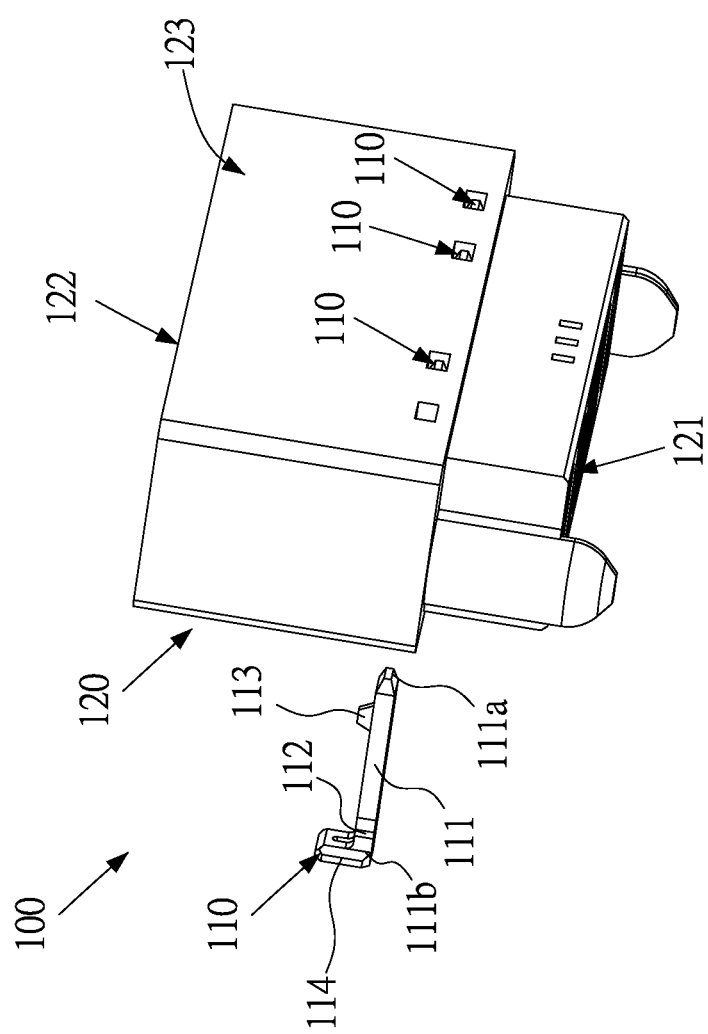
FIG. 2 illustrates another exploded view of the base of the electrical connector of the first embodiment.
Figure 3:
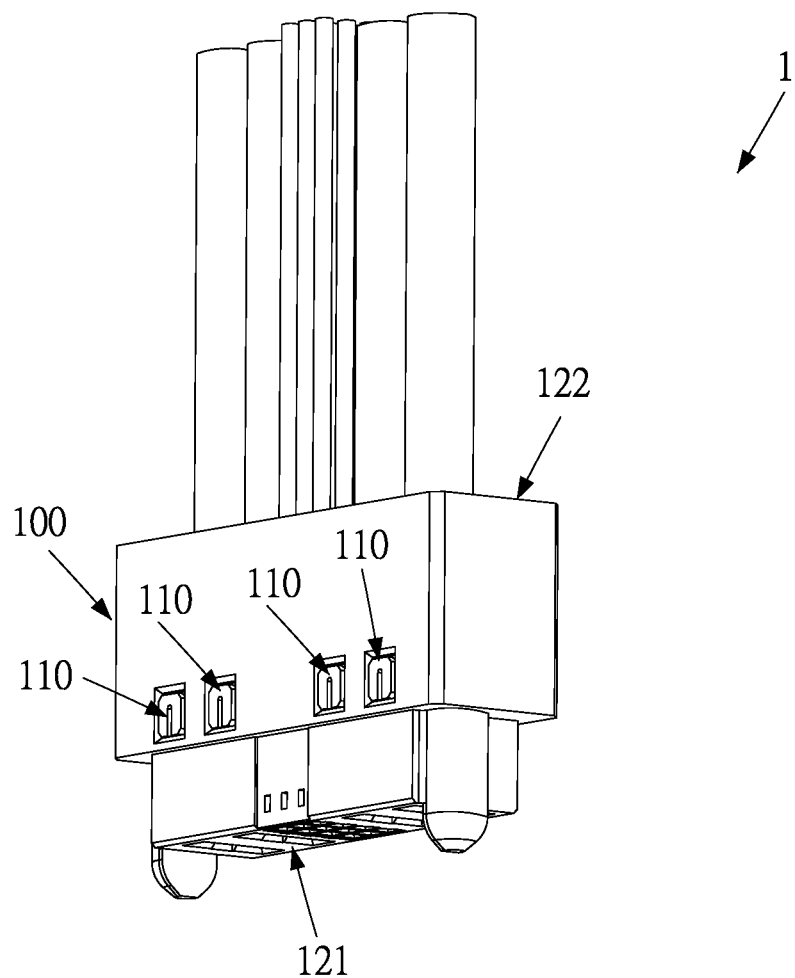
FIG. 3 illustrates a perspective view of the electrical connector of the first embodiment.

Referring to FIG. 1, FIG. 2, and FIG. 3, the first embodiment of this disclosure discloses a base 100 of an electrical connector. The base 100 of the electrical connector includes a fixing pin 110 and a base body 120.

Figure 4:
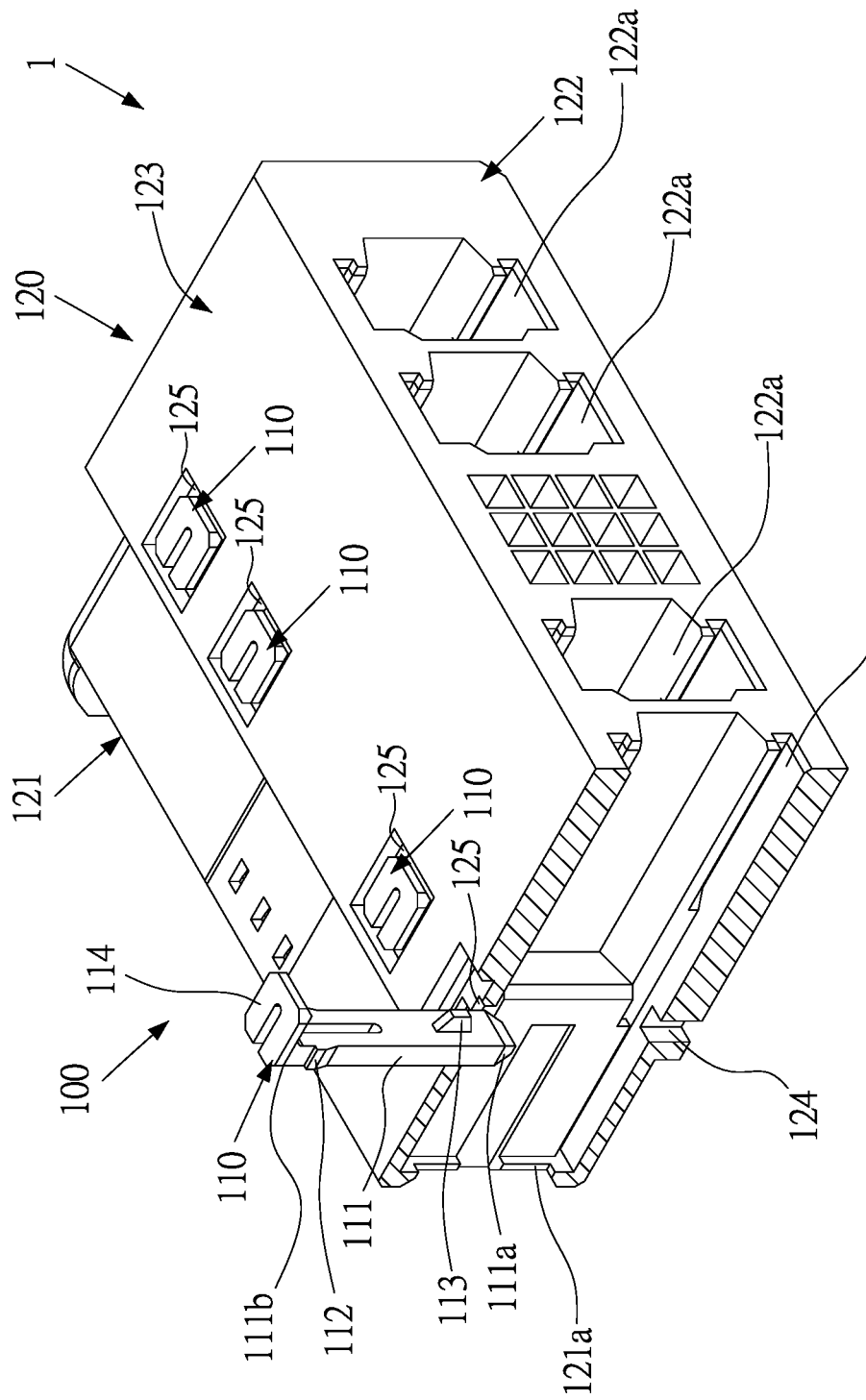
FIG. 4 illustrates a perspective partial sectional view of the electrical connector of the first embodiment.
Figure 5:
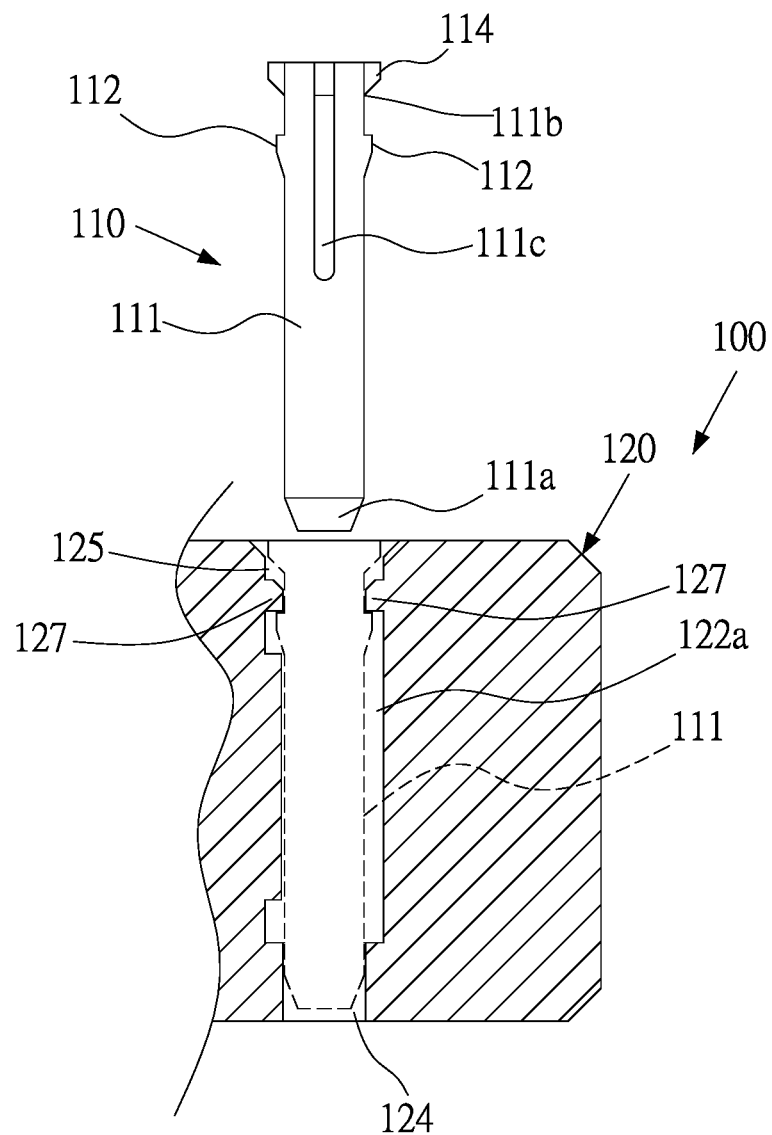
FIG. 5 illustrates a partial cross-sectional view of the base of the electrical connector of the first embodiment.

As shown in FIG. 4 and FIG. 5, the fixing pin 110 includes a pin body 111, two latches 112, a positioning portion 113, and a stopping element 114. The pin body 111 includes a lower end 111a and an upper end 111b. The stopping element 114 is disposed on the upper end 111b and extends toward a front side of the pin body 111. The cross-sectional area of the stopping element 114 perpendicular to the longitudinal direction of the pin body 111 is larger than the cross-sectional area of the pin body 111 perpendicular to the longitudinal direction of the pin body 111. The pin body 111 has a hollow part 111c, so that a position of the pin body 111 corresponding to a position of the hollow part 111c may be elastically deformed easily. The hollow part 111c may be a closed opening or an open slot. The opening of the opening slot may be located at the lower end 111a or at the upper end 111b. In the first embodiment, the hollow part 111c is an opening and extends to the stopping element 114.

As shown in FIG. 4 and FIG. 5, the two latches 112 are disposed on the pin body 111 in a protruding manner. More specifically, in this embodiment, the latches 112 are respectively disposed on two opposite sides of the pin body 111 and correspond to the hollow part 111c. The number of the latches 112 is not limited to two, and in one embodiment, the base 100 may be provided with a single latch 112 disposed on one side of the pin body 111 or the base 100 may be provided with a plurality of latches 112 respectively disposed on two opposite sides of the pin body 111. The positioning portion 113 is disposed on the pin body 111 in a protruding manner, especially in one embodiment, on the front side of the pin body 111. Therefore, a specific relative positional relationship can be formed among the positioning portion 113, the stopping element 114, and the latch 112.

As shown in FIG. 1, FIG. 2 and FIG. 3, the base body 120 is made of an electrical-insulated material. The base body 120 includes a front surface 121, a rear surface 122, and an outer peripheral surface 123. The front surface 121 and the rear surface 122 are opposite to each other. The outer peripheral surface 123 is connected to the front surface 121 and the rear surface 122.

As shown in FIG. 4, a plurality of installation troughs 122a is formed on the rear surface 122. Each of the installation troughs 122a is in communication with the front surface 121 through at least one insertion hole 121a. Moreover, the cross-sectional area of the insertion hole 121a is smaller than the cross-sectional area of the installation trough 122a, so that a stepped segment is formed between the insertion hole 121a and the installation trough 122a.

As shown in FIG. 4 and FIG. 5, the base body 120 further includes a pin hole 124 formed on the outer peripheral surface 123 of the base body 120, and the pin hole 124 is intersected with and in communication with the installation trough 122a. The pin hole 124 may or may not penetrate the base body 120. The pin hole 124 is adapted to be inserted by the fixing pin 110 from the lower end 111a of the pin body 111, and a shallow recess 125 is formed at the opening portion of the pin hole 124 for mating with the stopping element 114 of the fixing pin 110. After the fixing pin 110 is inserted into the pin hole 124, the stopping element 114 can be accommodated in the shallow recess 125, so that the fixing pin 110 does not continue to enter into the pin hole 124 and the fixing pin 110 does not protrude out of the outer peripheral surface 123, so that the flatness of the outer peripheral surface 123 may be maintained. Moreover, in one embodiment, a positioning groove 126 is formed on an edge of the shallow recess 125, and the positioning groove 126 allows the positioning portion 113 of the fixing pin 110 passing therethrough, thereby limiting the insertion direction of the fixing pin 110 when being inserting into the pin hole 124.

As shown in FIG. 4 and FIG. 5, a stopper block 127 is formed on an inner wall of the pin hole 124 for being engaged with the latch 112, so as to fix the fixing pin 110 in the pin hole 124. By having the hollow part 111c, a portion of the pin body 111 is easy to be elastically deformed, so that the latch 112 may be temporarily displaced and enter into the pin hole 124. This disclosure does not exclude the embodiments that the hollow part 111c is not provided. In some embodiments, upon inserting the fixing pin 110 into the pin hole 124, the fixing pin 110 and/or the latches 112 is/are deformed and enter into the pin hole 124 by the force applied to the fixing pin 110, so that the latches 112 are engaged with the stopper block 127.

Figure 6:
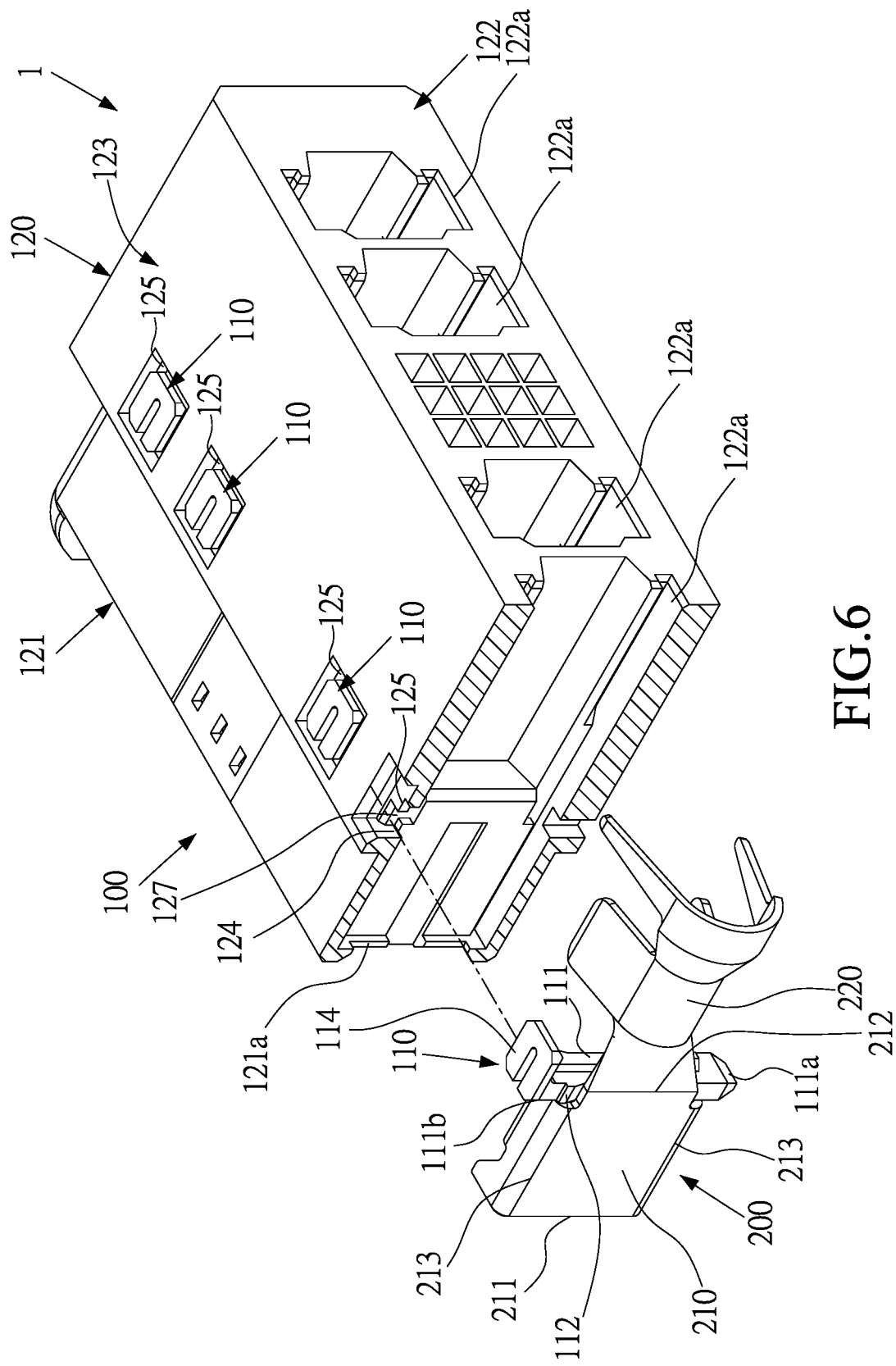
FIG. 6 illustrates a perspective partial sectional view of the electrical connector of the first embodiment.
Figure 7:
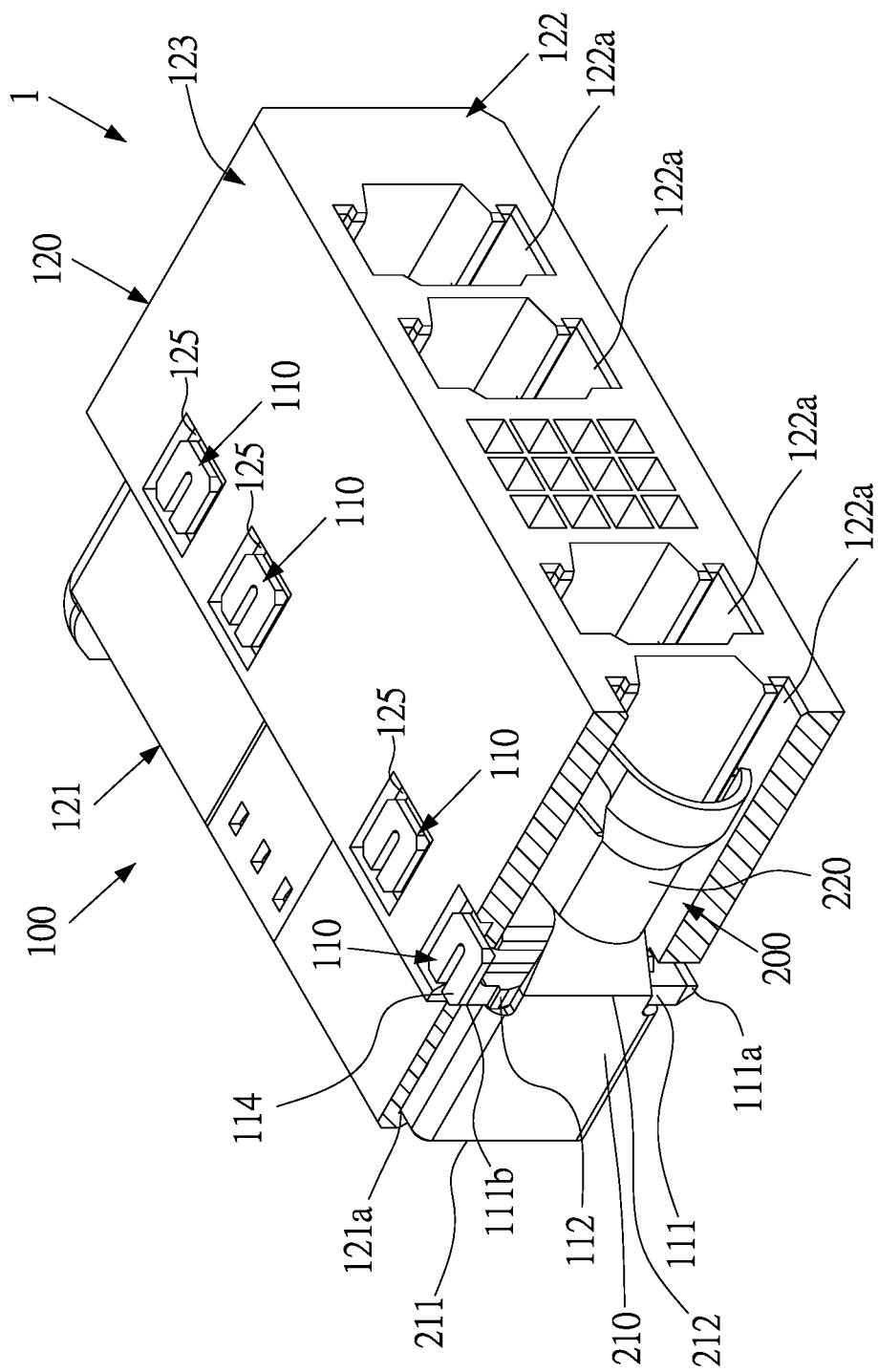
FIG. 7 illustrates another perspective partial sectional view of the electrical connector of the first embodiment.
Figure 8:
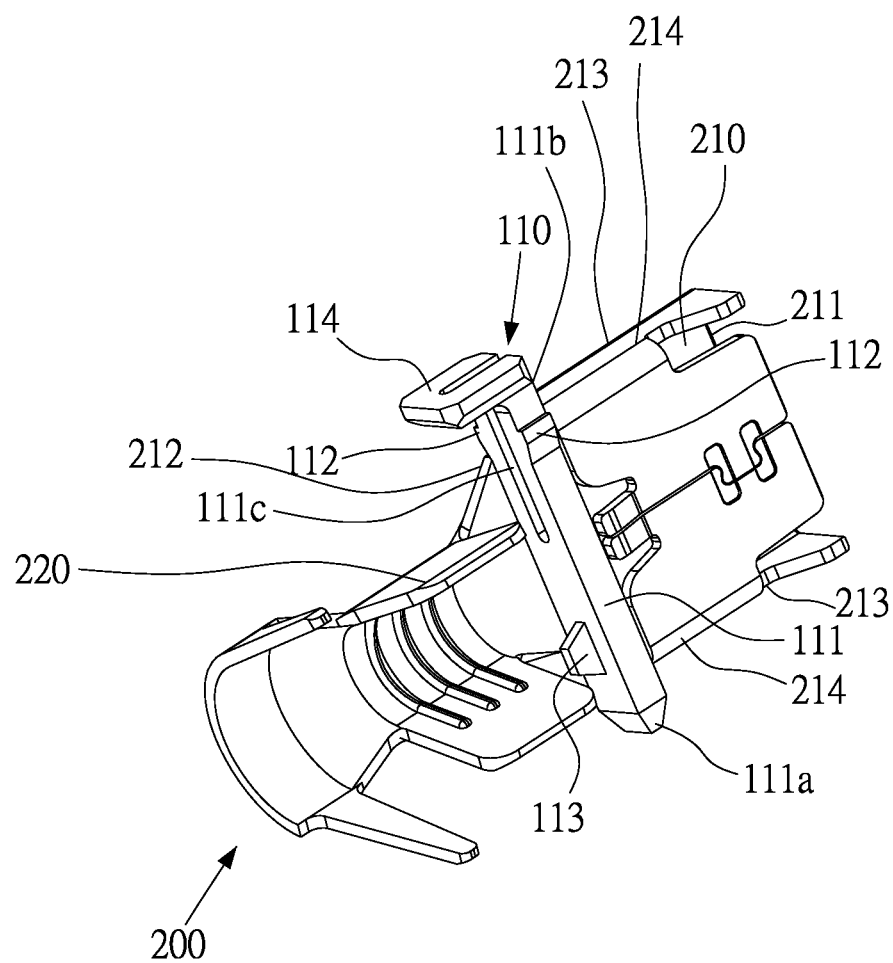
FIG. 8 illustrates a perspective view of the electrical terminal and the fixing pin of the first embodiment.

Please refer to FIG. 6, FIG. 7 and FIG. 8. The first embodiment further provides an electrical connector 1 including a base 100 and at least one electrical terminal 200.

As shown in FIG. 6, FIG. 7 and FIG. 8, the electrical terminal 200 includes a body portion 210 and a mounting portion 220. The body portion 210 includes a front edge 211, a rear edge 212, and two lateral edges 213. The mounting portion 220 extends from the rear edge 212, and the body portion 210 and the mounting portion 220 are disposed in the installation trough 122a. The front edge 211 of the body portion 210 abuts against the stepped segment between the insertion hole 121a and the installation trough 122a to prevent the electrical terminal 200 from detaching off the insertion hole 121a. At least one of the side edges 213 of the body portion 210 forms a bent portion 214. When the front edge 211 of the body portion 210 abuts against the stepped segment between the insertion hole 121a and the installation trough 122a, a portion of the bent portion 214 close to the rear edge 212 does not shield the pin hole 124.

As shown in FIG. 6, FIG. 7, and FIG. 8, when the fixing pin 110 is inserted into the pin hole 124, the pin body 111 of the fixing pin 110 stops the bent portion 214, so as to stop the bent portion 214 from moving toward the rear surface 122 of the base body 120, and thus the electrical terminal 200 does not detach off the installation trough 122a. In the first embodiment, two lateral edges 213 of the electrical terminal 200 respectively form a bent portion 214, and the two bent portions 214 further extend to contact each other to form a surrounding sleeve shape. The sleeve shape may match the internal shape of the installation trough 122a to prevent the electrical terminal 200 in the installation trough 122a from shaking. Moreover, the contact points between the electrical terminal 200 and the fixing pin 110 may be increased, thereby enhancing the fixation of the fixing pin 110 to the electrical terminal 200.

Figure 9:
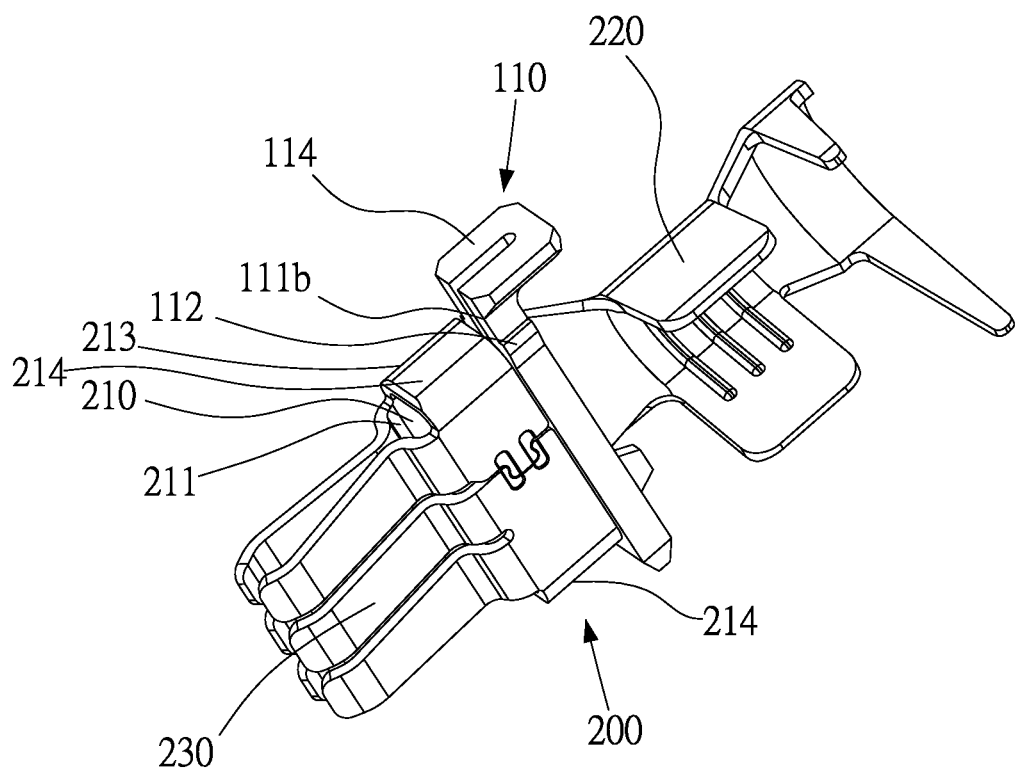
FIG. 9 illustrates a perspective view of an electrical terminal and a fixing pin according to a second embodiment of this disclosure.

As shown in FIG. 9, an electrical terminal 200 is disclosed according to the second embodiment of this disclosure. The structure of the electrical terminal 200 of the second embodiment is generally the same as that of the first embodiment. One of the difference is that the electrical terminal 200 of the second embodiment further includes a contact portion 230 formed on the front edge 211 of the body portion 210. The contact portion 230 is adapted to be inserted into the insertion hole 121a and protrudes out of the front surface 121 of the base body 120. The structure of the fixing pin 110 of the second embodiment is generally the same as that of the first embodiment, and is adapted to be inserted into the pin hole 124, so that the pin body 111 stops the bent portion 214 from moving toward the rear surface 122 of the base body 120.

Figure 10:
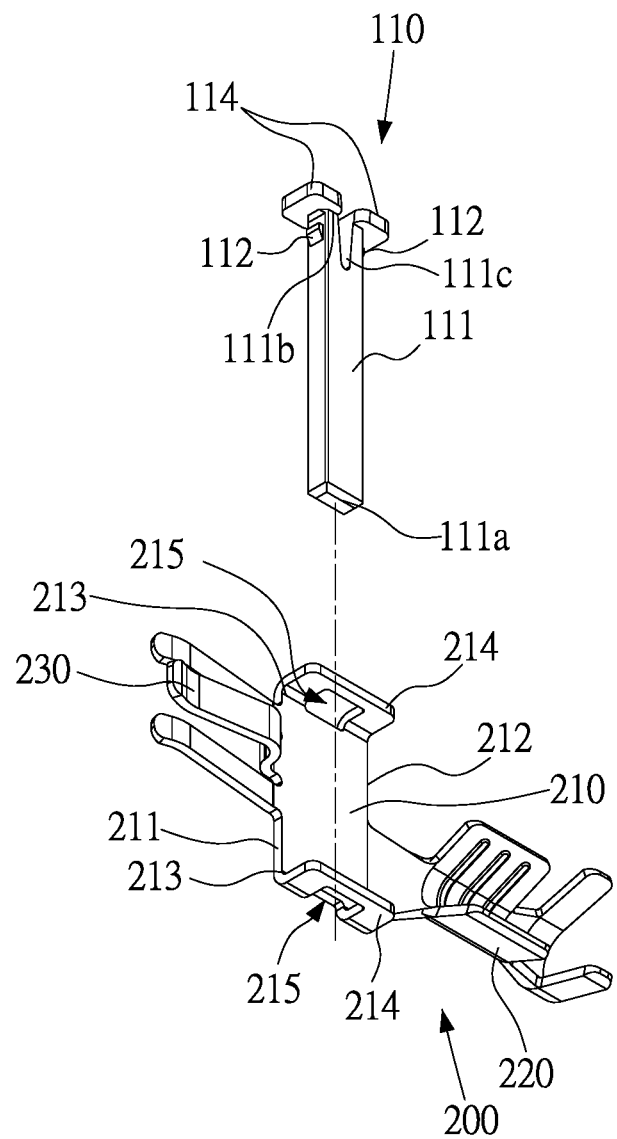
FIG. 10 illustrates an exploded view of an electrical terminal and a fixing pin according to a third embodiment of this disclosure.
Figure 11:
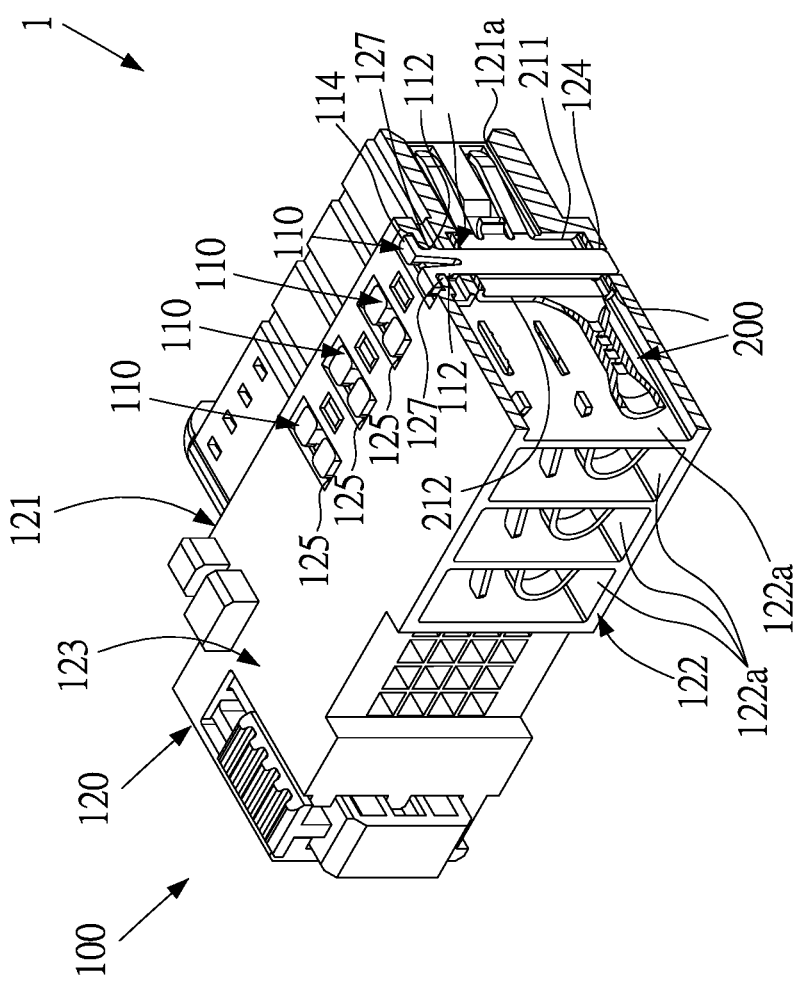
FIG. 11 illustrates a partial perspective sectional view of the electrical connector of the third embodiment.

As shown in FIG. 10 and FIG. 11, an electrical connector 1 disclosed in the third embodiment of this disclosure includes a base 100 and at least one electrical terminal 200. The base 100 includes a fixing pin 110 and a base body 120.

As shown in FIG. 10 and FIG. 11, the fixing pin 110 includes a pin body 111, two latches 112, and a stopping element 114. The pin body 111 has a lower end 111a and a upper end 111b. The stopping element 114 is disposed at the upper end 111b and extends toward two opposite sides of the pin body 111. The cross-sectional area of the stopping element 114 perpendicular to the longitudinal direction of the pin body 111 is larger than the cross-sectional area of the pin body 111 perpendicular to the longitudinal direction of the pin body 111. The pin body 111 has a hollow part 111c, so that a position of the pin body 111 corresponding to a position of the hollow part 111c may be elastically deformed easily. In the third embodiment, the hollow part 111c is an open slot, the opening of the hollow part 111c is located at the upper end 111b, and the stopping element 114 is divided into two parts by the hollow part 111c.

As shown in FIG. 10 and FIG. 11, the two latches 112 are disposed on the pin body 111 in a protruding manner, more specifically, in this embodiment, the two latches 112 are respectively disposed on two opposite sides of the pin body 111 and correspond to the hollow part 111c. The number of the latches 112 is not limited to two, and the base 100 may be provided with a single latch 112 disposed on one side of the pin body 111 or the base 100 may be provided with a plurality of latches 112 respectively disposed on two opposite sides of the pin body 111.

As shown in FIG. 10 and FIG. 11, the base body 120 is made of an electrical-insulated material. The base body 120 includes a front surface 121, a rear surface 122, and an outer peripheral surface 123. The front surface 121 and the rear surface 122 are opposite to each other. The outer peripheral surface 123 is connected to the front surface 121 and the rear surface 122.

As shown in FIG. 11, a plurality of installation troughs 122a is formed on the rear surface 122. Each of the installation troughs 122a is in communication with the front surface 121 through at least one insertion hole 121a. Moreover, the cross-sectional area of the insertion hole 121a is smaller than the cross-sectional area of the installation trough 122a, so that a stepped segment is formed between the insertion hole 121a and the installation trough 122a.

As shown in FIG. 11, the base body 120 further includes a pin hole 124 formed on the outer peripheral surface 123 of the base body 120, and the pin hole 124 is intersected with and in communication with the installation trough 122a. The pin hole 124 is adapted be inserted by the fixing pin 110 from the lower end 111a of the pin body 111, and a shallow recess 125 is formed at the opening portion of the pin hole 124 for mating with stopping element 114 of the fixing pin 110. Moreover, a stopper block 127 is further formed on an inner wall of the pin hole 124 for being engaged with the latch 112, so as to fix the fixing pin 110 in the pin hole 124.

As shown in FIG. 10 and FIG. 11, the electrical terminal 200 includes a body portion 210, a mounting portion 220, and a contact portion 230. The body portion 210 has a front edge 211, a rear edge 212, and two lateral edges 213. The contact portion 230 extends from the front edge 211, and the mounting portion 220 extends from the rear edge 212. The body portion 210 and the mounting portions 220 are disposed in the installation trough 122a, and the contact portion 230 is inserted into the insertion hole 121a. The front edge 211 of the body portion 210 abuts against the stepped segment between the insertion hole 121a and the installation trough 122a to prevent the electrical terminal 200 from detaching off the insertion hole 121a. At least one of the side edges 213 of the body portion 210 forms a bent portion 214. The bent portion 214 has a notch 215. At least at a portion of the notch 215 corresponding to the front edge 211 is closed. When the front edge 211 of the body portion 210 is abuts against the stepped segment between the insertion hole 121a and the installation trough 122a, the notch 215 and the pin hole 124 are in an overlapping configuration.

As shown in FIG. 11, when the fixing pin 110 is inserted into the pin hole 124, the fixing pin 110 further passes through the notch 215, and thus the pin body 111 stops the bent portion 214, so as to stop the bent portion 214 from moving toward the rear surface 122 of the base body 120. Therefore, the electrical terminal 200 does not detach off the installation trough 122a.

Figure 12:
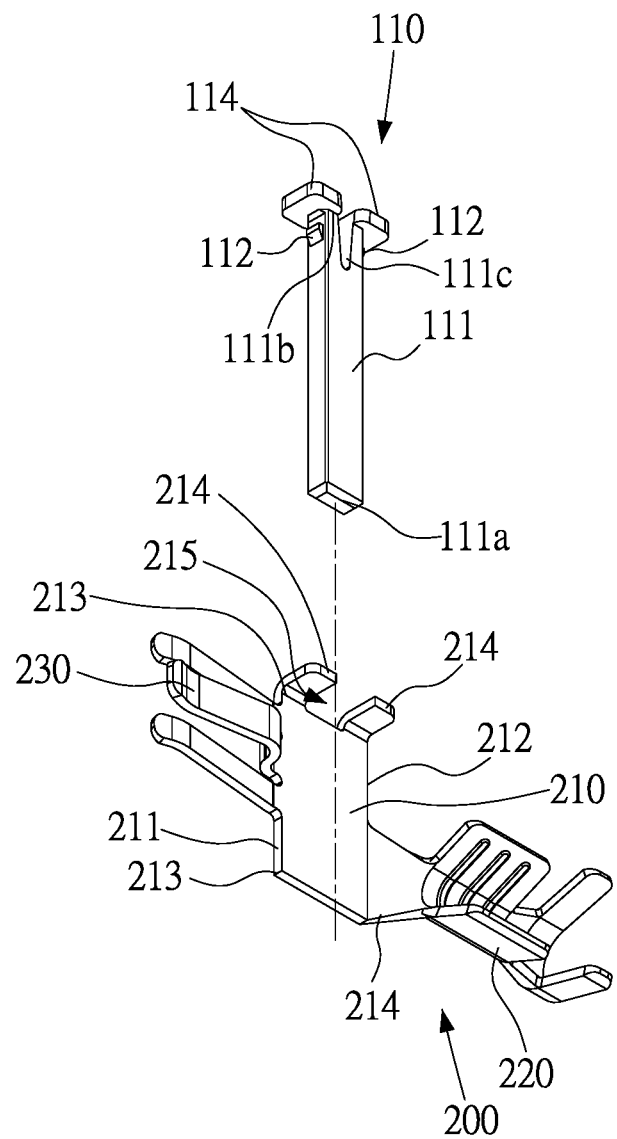
FIG. 12 illustrates another exploded view of the electrical terminal and the fixing pin of the third embodiment.
Figure 13:
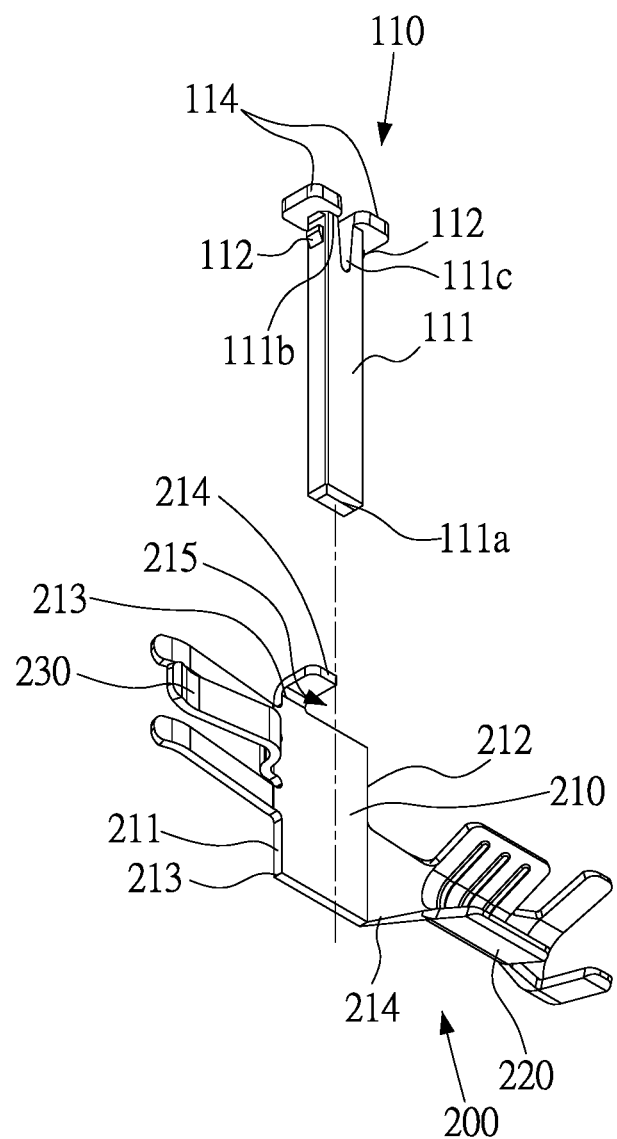
FIG. 13 illustrates yet another exploded view of the electrical terminal and the fixing pin of the third embodiment.

As shown in FIG. 10, FIG. 12, and FIG. 13, the notch 215 of the bent portion 214 may be an opening, a recessed structure formed on the edge of the bent portion 214, or an edge of a sheet structure formed on the edge of the bent portion 214. As long as the side of the notch 215 corresponding to the front edge 211 is closed, the fixing pin 110 can pass through the notch 215 and the bent portion 214 can be stopped by the pin body 111. Furthermore, the base 100 does not require the bent portion 214 arranged in pairs; in one embodiment the bent portion 214 may be disposed only on one of the side edges 213. Alternatively, in the case that the base 100 is provided with two bent portions 214, the notch 215 is arranged only on the bent portion 214 corresponding to the entrance opening of the pin hole 124.

In one or more embodiments of this disclosure, the fixing pin 110 can be firmly fixed in the base body 120 through a simple insertion operation to form the base 100 of the electrical connector having a fixed structure. As long as the electrical terminal 200 has a bent portion 214 capable of interfering with the fixing pin 110, the electrical terminal 200 can be applied to the base 100 of the electrical connector. The electrical terminal 200 and base 100 can be quickly assembled into the electrical connector 1, which effectively accelerates the assembly process of the electrical connector 1.

What is claimed is:

1. A base of an electrical connector, comprising:
   a fixing pin, comprising a pin body, at least one latch and a stopping element, wherein the pin body has a lower end and a upper end, the stopping element is disposed at the upper end, and the at least one latch is disposed on the pin body in a protruding manner; and
   a base body, having a front surface, a rear surface, and an outer peripheral surface, wherein the front surface and the rear surface are opposite to each other, and the outer peripheral surface is connected to the front surface and the rear surface; at least one installation trough is formed on the rear surface and the at least one installation trough is in communication with the front surface through an insertion hole; the base body further comprises a pin hole formed on the outer peripheral surface, and the pin hole is intersected with and in communication with the at least one installation trough; at least one stopper block is formed on an inner wall of the pin hole;
   the pin hole is adapted to be inserted by the fixing pin, and the at least one latch is adapted to be engaged with the at least one stopper block;
   wherein a shallow recess is formed at an opening portion of the pin hole for receiving the stopping element; and
   wherein the fixing pin further comprises a positioning portion disposed on the pin body in a protruding manner, and a positioning groove is formed on an edge of the shallow recess for allowing the positioning portion to pass therethrough.

2. The base of the electrical connector as claimed in claim 1, wherein the fixing pin comprises two of the latches, and the two latches respectively disposed on two opposite sides of the pin body in a protruding manner.

3. The base of the electrical connector as claimed in claim 1, wherein the stopping element extends toward a front side of the pin body.

4. The base of the electrical connector as claimed in claim 1, wherein the stopping element is disposed at the upper end and extends toward two lateral sides of the pin body.

5. The base of the electrical connector as claimed in claim 1, wherein the pin body further comprises a hollow part, and a position of the at least one latch corresponds to a position of the hollow part.

6. The base of the electrical connector as claimed in claim 5, wherein the hollow part is a closed opening.

7. The base of the electrical connector as claimed in claim 6, wherein the hollow part is an open slot, and an opening of the open slot is at the lower end or the upper end.

8. An electrical connector, comprising:
   a base of an electrical connector, comprising:
      a fixing pin, comprising a pin body, at least one latch and a stopping element, wherein the pin body has a lower end and a upper end, the stopping element is disposed at the upper end, and the at least one latch is disposed on the pin body in a protruding manner; and
      a base body, having a front surface, a rear surface, and an outer peripheral surface, wherein the front surface and the rear surface are opposite to each other, and the outer peripheral surface is connected to the front surface and the rear surface; at least one installation trough is formed on the rear surface and the at least one installation trough is in communication with the front surface through an insertion hole; the base body further comprises a pin hole formed on the outer peripheral surface, and the pin hole is intersected with and in communication with the at least one installation trough; at least one stopper block is formed on an inner wall of the pin hole; the pin hole is adapted to be inserted by the fixing pin, and the at least one latch is adapted to be engaged with the at least one stopper block; and
   at least one electrical terminal, including a body portion and a mounting portion, wherein the body portion comprises a front edge, a rear edge, and two lateral edges; the mounting portion extends from the rear edge; the body portion and the mounting portion are disposed in the at least one installation trough; at least one of the lateral edges of the body portion forms a bent portion; when the fixing pin is inserted into the pin hole, the pin body stops the bent portion, so as to stop the bent portion from moving toward the rear surface of the base body.

9. The electrical connector as claimed in claim 8, wherein a cross-sectional area of the insertion hole is smaller than a cross-sectional area of the at least one installation trough, so that a stepped segment is formed between the insertion hole and the at least one installation trough; when the front edge of the body portion abuts against the stepped segment between the insertion hole and the at least one installation trough, a portion of the bent portion close to the rear edge does not shield the pin hole.

10. The electrical connector as claimed in claim 8, wherein the electrical terminal further comprises a contact portion formed at the front edge of the body portion for being inserted into the insertion hole.

11. The electrical connector as claimed in claim 8, wherein the bent portion comprises a notch, and at least on a portion of the notch corresponding to the front edge is closed; when the fixing pin is inserted into the pin hole, the fixing pin further passes through the notch.

12. The electrical connector as claimed in claim 8, wherein the bent portion comprises a notch; the notch is an opening, a recessed structure formed on an edge of the bent portion, or an edge of a sheet structure formed on the edge of the bent portion.

* * * * *